United States Patent [19]

Gautier et al.

[11] Patent Number: 4,857,870
[45] Date of Patent: Aug. 15, 1989

[54] METHOD OF MANUFACTURING A SURFACE WAVE DISPERSIVE FILTER AND A FILTER MANUFACTURED IN ACCORDANCE WITH THIS METHOD

[75] Inventors: Hervé Gautier, Antibes; Claude Lardat, Rochquefort Les Pins, both of France

[73] Assignee: Thomson-CSF, Paris, France

[21] Appl. No.: 86,142

[22] PCT Filed: Nov. 25, 1986

[86] PCT No.: PCT/FR86/00402

§ 371 Date: Jul. 20, 1987

§ 102(e) Date: Jul. 20, 1987

[87] PCT Pub. No.: WO87/03756

PCT Pub. Date: Jun. 18, 1987

[30] Foreign Application Priority Data

Dec. 4, 1985 [FR] France .................................. 85 17947

[51] Int. Cl.⁴ .............................................. H04H 3/10
[52] U.S. Cl. .................................... 333/195; 333/196; 310/313 B; 310/313 C
[58] Field of Search ................................. 333/193–196; 310/313 R, 313 B, 313 C, 313 D; 29/23, 35

[56] References Cited

U.S. PATENT DOCUMENTS

| | | | |
|---|---|---|---|
| 3,699,364 | 10/1972 | Gerard | 310/313 C |
| 3,753,166 | 8/1973 | Worley et al. | 310/313 C X |
| 3,946,342 | 3/1976 | Hartmann | 333/196 |
| 4,314,393 | 2/1982 | Wakatsuki et al. | 29/25.35 |
| 4,375,624 | 3/1983 | DeVries | 333/194 |
| 4,460,995 | 7/1984 | DeVries | 310/313 R |
| 4,672,254 | 6/1987 | Delat et al. | 333/193 X |

FOREIGN PATENT DOCUMENTS 609415  9/1983  U.S.S.R. ............................ 333/194

OTHER PUBLICATIONS

Anderson, A. C. et al.; "Attenuating Thin Films for SAW Devices", 1980, *IEEE Ultrasonics Symposium Proceeding*, Nov. 5–7, 1980, pp. 442–445.

Electronic Engineering, vol. 49, No. 592, May 1977, (Londres, GB), J. M. Autran et al.: "Application of Cad Techniques to Saw Filters", pp. 51–54.

IEEE Proceedings, vol. 131, No. 4, Partie A, Jun. 1984, (Old Woking, Surrey, GB), M. F. Lewis et al., "Recent Developments in SAW Devices", voir FIGS. 4, 11–14; pp. 194–195: Weighting Methods; FIG. 28; pp. 202–203; Reflective Array Compressor (RAC); FIG. 10; p. 193: Multistrip Couplers.

*Primary Examiner*—Eugene R. LaRoche
*Assistant Examiner*—Benny Lee
*Attorney, Agent, or Firm*—Oblon, Spivak, McClelland, Maier & Neustadt

[57] ABSTRACT

The invention provides a method of producing surface wave dispersive filters of RAC type, in which, in an RAC of known type, one of the input or output transducers is replaced by a transducer forming a surface wave filter and whose transfer function allows the errors of the initial transfer function of the RAC to be corrected.

11 Claims, 2 Drawing Sheets

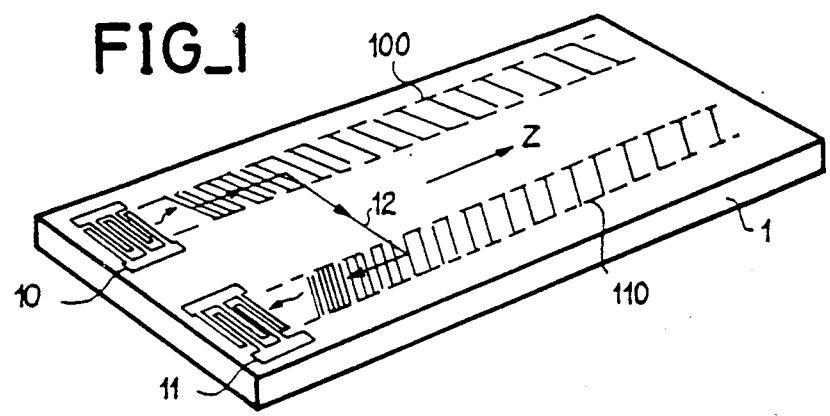
FIG_1
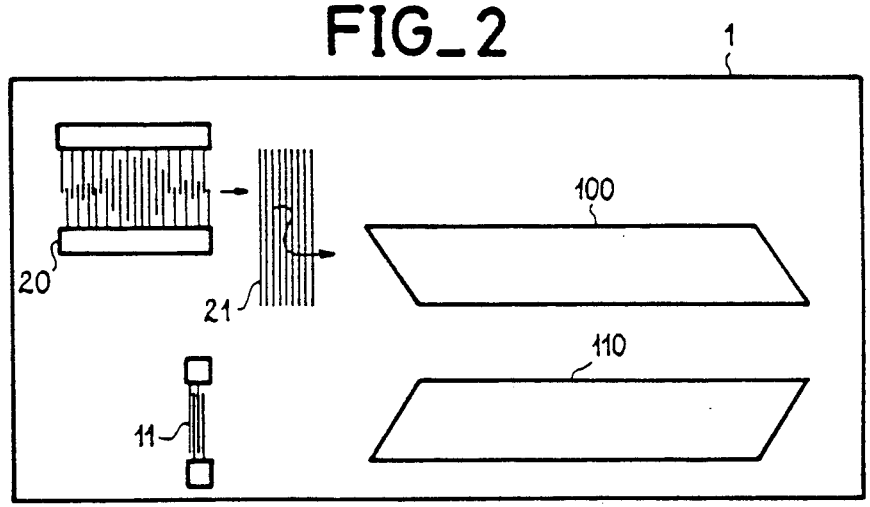
FIG_2
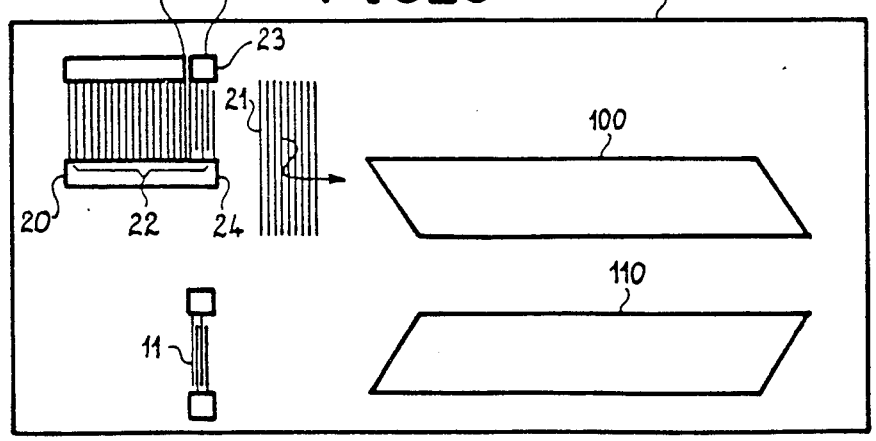
FIG_3

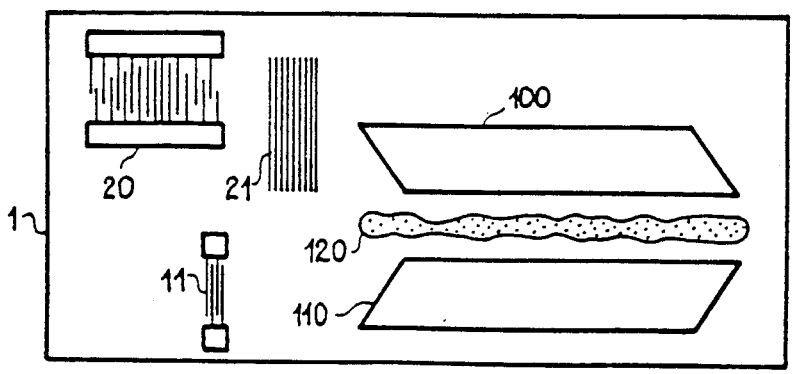
FIG_4
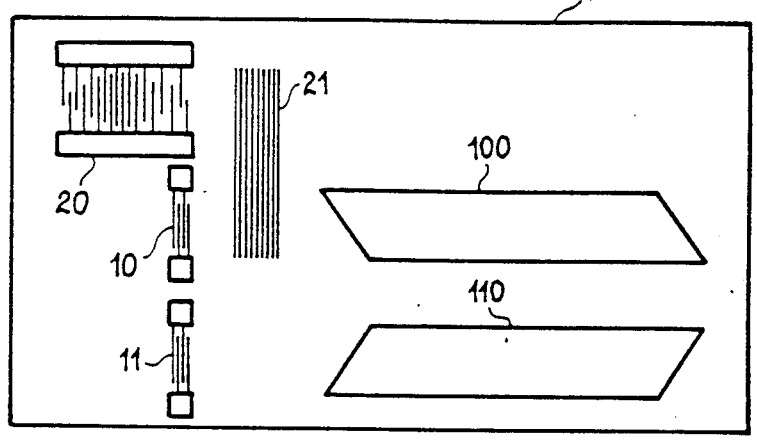
FIG_5
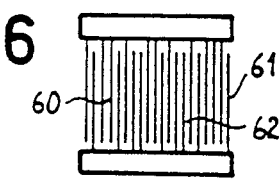
FIG_6
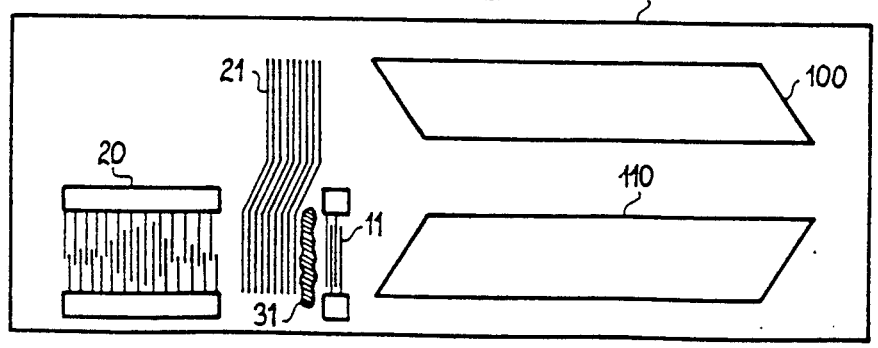
FIG_7

METHOD OF MANUFACTURING A SURFACE WAVE DISPERSIVE FILTER AND A FILTER MANUFACTURED IN ACCORDANCE WITH THIS METHOD

BACKGROUND OF THE INVENTION

The present invention relates to methods of manufacturing surface wave dispersive filters using the reflection of acoustic waves from variable pitch networks slanted with respect to the propagation of these acoustic waves.

These filters are known under the name of "reflective array compressors" abbreviated to RAC. The product of the pass band multiplied by the signal time, called BT, of these filters is very high, which forms the advantage thereof.

An RAC corresponding to the state of the art is shown in FIG. 1. It includes, on a piezoelectric substrate 1, an integerdigitated transmitting transducer 10 which, from the signal to be compressed, sends an acoustic wave in the direction of a first reflecting network 100. This network includes a series of discontinuities in the form of lines slanted substantially at 45° with respect to the axis of propagation Z of the acoustic wave. These discontinuities, as well as transducer 10 and transducer 11 which will be discussed further on, are formed by etchings or metallizations on the surface of the substrate.

The acoustic wave is reflected by network 100 substantially at 90° towards a second network 110 identical to the first one but symmetric with respect to axis Z. The acoustic wave is then reflected substantially at 90° from the second network in the direction opposite axis Z.

It is then picked up by an output transducer 11 which it energizes so as to give an electric output signal.

The spacing between the discontinuities in the two reflecting networks is variable as a function of the distance to the input and output transducers. Thus, the reflecting power is variable with the frequency and depending on this frequency the acoustic wave will travel over a path such as 12 whose length, and so duration, will depend on the frequency.

The overall transfer function of this device corresponds to the product of the transfer functions of the input and output transducers and of the reflecting networks and causes compression of the pulse applied to the input transducer.

Such a device, because of different parasitic phenomena, does not then give directly the desired amplitude and phase response in the useful band.

To correct the amplitude and phase defects, it is known to correct the response of the RAC by means of a conventional electric filter, of RLC type, connected in series with this RAC. The transfer function of the RAC is measured and from this a filter is synthesized using known methods having a transfer function for correcting that of the RAC.

In this case at the level of the correction filter known drawbacks are added such as insertion loss, space required and the influence of the different drifts, particularly temperature drifts.

It is further known, but solely in so far as the phase error is concerned, to correct this latter by placing between the two reflecting networks 100 and 110 a conducting film of variable width and thickness so as to modify the propagation speed for each path of the waves and so for each frequency. This method however does not correct the fluctuations of rapid errors.

SUMMARY OF THE INVENTION

The invention uses in such an RAC, an input or output transducer designed so as to have a transfer function which corrects the defects of the RAC.

In accordance with a particular feature of the invention, the RAC is first of all formed with ordinary input and output transducers, its transfer function is measured, then at least one of these transducers is replaced by a transducer calculated for correcting this transfer function.

BRIEF DESCRIPTION OF THE DRAWINGS

Other features and advantages of the invention will be clear from the following description, with reference to the accompanying Figures which show:

FIG. 1, an RAC filter of the prior art;
FIG. 2, an RAC filter of the invention;
FIGS. 3, 4, 5, 7 variants of construction of an RAC filter of the invention; and
FIG. 6, a variant of the transducer 20 of these RAC filters.

DESCRIPTION OF THE PREFERRED EMBODIMENTS

The dispersive filter of RAC type of the invention, shown in FIG. 2, includes on a substrate 1 two reflecting networks 100 and 110, shown here schematically, and an output transducer 11. These elements are identical to those of known RACs.

The input transducer 20 is formed of two interdigitated combs in which the number of teeth and the unequal overlapping lengths of these teeth allow a given transfer function to be obtained and calculated beforehand. The method of synthesizing such a transducer is well known from French Pat. No. 2,040,881.

Since, however, the acoustic field produced by such a transducer is not homogeneous, because the sound waves travel through zones metallized to a higher or lesser degree, it is preferable, so as to obtain a uniform incident wave front which does not affect the response of the reflector networks 100 and 110, to use a coupler 21 whose advantages are known in the art.

The transfer function of transducer 20 and of coupler 21 is calculated so as to compensate for the phase and amplitude errors of the rest of the RAC. To determine this transfer function and to calculate the geometry of the transducer 20 accordingly, a method is used whose steps are the following:

First of all a conventional RAC is produced, such as shown in FIG. 1, on a sufficiently long substrate so as to then be able to implant the transducer 20 and coupler 21.

Then the transfer function HM(f) of the filter is measured, not only in amplitude but also in phase.

Then the transfer function HE(f) of the provisional input transducer is measured. This calculation may be made using the same method as that for synthesizing the transducer 20 since the structure of transducer 10 is of the same kind but extremely simplified for it includes very few teeth and the overlapping thereof is constant.

Then, from the errorless transfer function to be obtained Hc(f) the transfer function H(f) of the input correction transducer 20 is calculated using the formula:

$$H(f) = H_E(f) \times \frac{H_c(f)}{H_M(f)}$$

Then the geometry of transducer 20 is determined by a known synthesis method. This method uses a computing program which synthesizes the transducers, from a given transfer function, so that once formed they show errors less than the errors to be corrected. This program takes into account the influence of the coupler.

In a last step, the provisional input transducer is finally replaced by the final correction transducer 20. For that, the provisional transducer may be selectively etched, for example, then the final transducer formed by vacuum metal deposition.

Multiple variants are possible from this basic arrangement.

Firstly, it is possible to replace the output transducer instead of the input transducer by a correction transducer, and even to replace the input transducer and the output transducer each by a correction transducer which each take into account a part of the correction to be made.

In a variant shown in FIG. 3, an RAC already including the coupler 21 and the input transducer 20 was produced for the measurements. However, in this input transducer 20, only the four teeth the closest to coupler 21 are isolated from the two supply electrodes 23 and 24 and are of constant length thus forming the provisional transducer. The assembly of the other teeth 22 is connected on both sides to electrodes 23 and 24 and these teeth are thus inactive. Electrodes 23 is cut with a gap so as to avoid short circuiting. The provisional transducer is fed from the electrodes 230 and 24.

When the length to be given to the different teeth so as to obtain a corrected RAC has been determined, it is sufficient to remove an appropriate part of the teeth, for example by laser machining. The two sides of electrode 23 are then connected.

In a variant of construction, shown in FIG. 4, a conducting film 120 placed between the two networks 100 and 110 is used for correcting the phase errors. The input transducer 20 is then calculated solely for correcting the amplitude errors, which simplifies its construction. On the other hand, the rapid phase error fluctuations are less well corrected.

It is also possible to avoid using coupler 21 by not using in transducer 20 weighting by the length of the teeth, but weighting by a method causing the acoustic wave produced to have a uniform wave front. For that, several techniques may be used such as the withdrawal technique or by capacitive coupling.

One transducer example weighted by withdrawal is shown in FIG. 6, where it can be seen that the length overlap between the teeth is everywhere the same and that, by suppressing certain teeth, sources are created with zero amplitudes such as 60, with amplitude −1 such as 61 and with amplitude +1 such as 62.

Another method used so as not to have to take into account in the calculation the influence of coupler 21 consists, as shown in FIG. 5, in using a coupler whose length is sufficient so that the correction transducer 20 is situated entirely outside the front face of network 100. In this case the measurement transducer 19 may be placed facing this front face and on the same side of coupler 21 as the correction transducer. Thus, these two transducers may be formed at the same time and in fact at the same time as coupler 21, as networks 100 and 110 and as the output transducer 11, in a single metallization operation. In this case transducer 10 is used for measuring the transfer function of the rest of the RAC, including coupler 21, and taking into account the results of this measurement, the transducer 20 is adjusted by laser machining for example. The corrected RAC is then ready and it is sufficient to connect the input connections to transducer 20 while leaving transducer 10 unused without having to remove this latter from the surface of the substrate 1.

Coupler 21 may also be implanted at the outset. In the synthesis of the correction transducer, the influence of the coupler is then no longer to be taken into account.

Another variant finally avoids increasing the width of the substrate at the price of an increase in its length, which is sometimes preferable considering the methods of manufacturing substrates. For that, as shown in FIG. 7, the correction transducer 20 is implanted towards the bottom of the substrate on the network 110 side. Coupler 21 is then formed in a way known per se so as to bring the acoustic waves back to network 100.

So as to prevent the part of the acoustic waves which passes through the reception transducer 11 from disturbing not only transducer 20 but also network 100 via coupler 21, a layer of absorbant material 31 is deposited on substrate 1 between transducer 11 and coupler 21, using a known technique.

Such a method allows a dispersive filter of RAC type to be formed with an amplitude characteristic controlled within 0.5 decibel. Since the amplitude errors found in RACs formed in accordance with the prior art may reach 4 decibels, the invention therefore improves the accuracy of the RAC by a factor close to 10.

What is claimed is:

1. A method of manufacturing a dispersive wave filter having a desired transfer function of the type including a substrate, an input transducer for transmitting an acoustic wave over the surface of the substrate, an output transducer for receiving these waves, and dispersive means situated in the path of the waves for modifying the travel time thereof between the two transducers as a function of their frequency, including the following steps:

manufacture of a conventional noncorrected dispersive filter, at least one of the input and output transducers of which has a known transfer function;

measurement of the transfer function of this filter by applying an input signal to said input transducer and monitoring the corresponding output signal from said output transducer;

determining the undesired effects of the transfer function by comparing the desired transfer function with the measured transfer function;

designing in response to said measurement of the transfer function of said filter a correction transducer having a transfer function having effects opposed to the undesired effects of the transfer function of this filter for correcting the transfer function of this filter;

producing this correction transducer on the substrate to replace the transducer having a known transfer function.

2. The method as claimed in claim 1, wherein said correction transducer has an interdigitated comb structure having teeth overlapping along a predetermined length and the designing method used consists of modifying said overlapping lengths for modifying the transfer function of the transducer.

3. The method as claimed in claim 2, wherein the transducer having a known transfer function has an interdigitated comb form having teeth with access electrodes connected to the teeth in which the greatest part of the teeth are short circuited between the access electrodes of the transducer and the corrected transducer is produced by machining the teeth to the length determined during the designing step.

4. The method as claimed in any one of claims 1 to 3, wherein a multi-strip coupler is implanted on the substrate between the correction transducer and the dispersive means.

5. The method as claimed in claim 4, wherein the coupler is implanted during manufacture of the uncorrected dispersive filter.

6. The method as claimed in claim 4 wherein said coupler is of a sufficient size to allow the correction transducer to be implanted while leaving on the substrate the transducer which it replaces.

7. The method as claimed in claim 1, wherein a correction transducer is designed to work also as a multi-strip coupler having teeth.

8. The method as claimed in claim 7, wherein this designing is made by suppressing teeth of said multi-strip coupler.

9. The method as claimed in claim 1, wherein said undesired effects include phase errors which are corrected at least partially by depositing a conducting layer on the surface of the substrate and in the path of the acoustic waves between the dispersive means.

10. The method as claimed in claim 1, wherein said input and output transducers have a known transfer function and a correction transducer replaces each of these transducers; the combination of the transfer functions of these two correction transducers allowing the transfer function of the filter to be corrected.

11. A surface wave dispersive filter manufactured in accordance with the method as claimed in claim 1, wherein said dispersive means include two reflecting networks arranged in parallel in a first direction and being variably spaced in a second direction in which the acoustic waves enter in said first direction and leave in the opposite direction, a coupler extending in said second direction without extending beyond the networks in said second direction and situated on the other side of these networks with respect to the output transducer so that said correction transducer does not extend beyond the reflecting networks in said second direction and in that it has on the surface of the substrate an absorbant material inserted between the coupler and the output transducer.

* * * * *